United States Patent [19]

Naito

[11] Patent Number: 4,677,422
[45] Date of Patent: Jun. 30, 1987

[54] MULTIPLE INPUT SIGNAL HIGH-SPEED ANALOG-DIGITAL CONVERTER CIRCUIT

[75] Inventor: Kazufumi Naito, Ohtsu, Japan

[73] Assignee: Kabushiki Kaisha Ishida Koki Seisakusho, Kyoto, Japan

[21] Appl. No.: 679,999

[22] Filed: Dec. 10, 1984

[30] Foreign Application Priority Data

Dec. 8, 1983 [JP] Japan .................................. 58-232119

[51] Int. Cl.⁴ ............................................ H03M 1/00
[52] U.S. Cl. ...................... 340/347 SH; 340/347 AD; 340/347 M
[58] Field of Search .................. 340/347 SH, 347 AD, 340/347 M; 328/151; 358/138; 307/353; 364/178, 179

[56] References Cited

U.S. PATENT DOCUMENTS

| | | | |
|---|---|---|---|
| 3,597,761 | 8/1971 | Fraschilla et al. | 340/347 AD |
| 3,732,376 | 5/1973 | Chatelon | 179/15 |
| 4,232,302 | 11/1980 | Jagatich | 340/347 AD |
| 4,353,057 | 10/1982 | Bernet et al. | 340/347 SH |

FOREIGN PATENT DOCUMENTS 0006779 1/1980 France .

OTHER PUBLICATIONS

The Engineering Staff of Analog Devices, Inc., Analog-Digital Conversion Handbook, 6/1972, pp. I-32 to I-37; III-73 to III-86.

Zuch, Pick Sample-Holds by Accuracy and Speed . . . , Electronic Design 26, 20 Dec. 1978, pp. 84–90.

Primary Examiner—T. J. Sloyan
Attorney, Agent, or Firm—Staas & Halsey

[57] ABSTRACT

A multiple input signal high-speed analog-digital converter circuit for digitizing, by means of an A/D converter, an output signal from a multiplexer which successively delivers multiple input signals applied thereto. Two sample/hold circuits which receive the output signal from the multiplexer repeatedly sample and hold the signal, and a changeover switch keeps one of the sample/hold circuits on hold while the other sample/hold circuit samples the output signal from the multiplexer. While one of the sample/hold circuits is holding the signal, the other sample/hold circuit is sampling another signal so that the A/D conversion time of multiple input signals is capable of being reduced by the sampling time.

2 Claims, 4 Drawing Figures

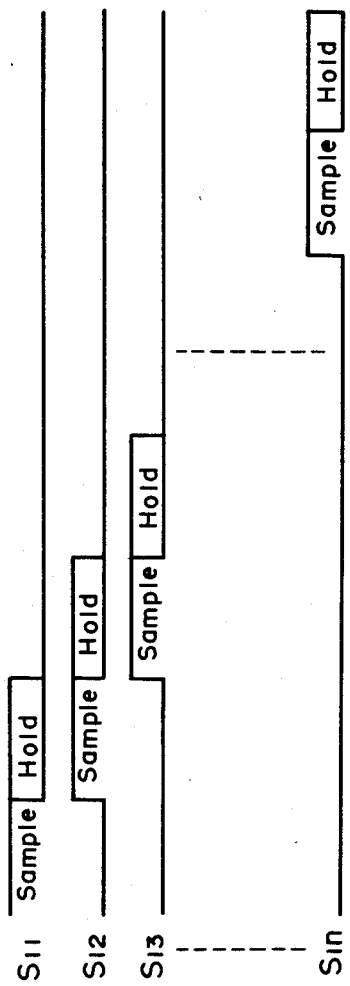

MULTIPLE INPUT SIGNAL HIGH-SPEED ANALOG-DIGITAL CONVERTER CIRCUIT

BACKGROUND OF THE INVENTION

This invention relates to a multiple input signal high-speed analog-digital converter circuit for converting a number of analog signals into digital signals at high speed.

A multiple input signal analog-digital converter circuit finds use in devices such as a combinatorial weighing apparatus.

A combinatorial weighing apparatus operates by supplying a plurality of weighing machines with articles to be weighed, computing combinations based on weight values obtained from the weighing machines, selecting a combination giving a total combined weight value equal or closest to a target weight, and discharging the articles solely from those weighing machines corresponding to the selected combination, thereby providing a batch of weighed articles having a weight equal or closest to the target weight.

Such a combinatorial weighing apparatus will now be described briefly with reference to FIG. 1. The apparatus includes load cells $10_{-1}, 10_{-2} \ldots 10_{-n}$ for sensing the weight of articles introduced into the respective weighing hoppers belonging to n weighing machines. Each load cell produces a weight signal, namely an analog value indicative of the weight sensed thereby. The weight signals from these load cells $10_{-1}, 10_{-2} \ldots 10_{-n}$ are applied as multiple input signals $S_1, S_2 \ldots S_n$ to a multiplexer 13 via amplifier circuits $11_{-1}, 11_{-2} \ldots 11_{-n}$ and filters $12_{-1}, 12_{-2} \ldots 12_{-n}$, respectively. The multiplexer 13, which is composed of analog switches or the like, responds to a selection signal $S_{cl}$ from a computation controller 20, described below, by selectively applying the weight signals $S_1, S_2 \ldots S_n$ as a weight data signal $S_o$ to a buffer circuit 14 sequentially in a time series. The buffer circuit 14 delivers the weight data signal $S_o$ received from the multiplexer 13 to a sample/hold circuit 15 upon subjecting the signal to an impendance conversion. The sample/hold circuit 15 repeatedly samples and holds the weight data signal $S_o$ subjected to the impedance conversion by the buffer circuit 14, and delivers the weight data signal to a buffer circuit 17. The latter subjects the signal to an impendance conversion, producing an analog weight data signal $S_p$ which is delivered to an analog-digital converter (A/D converter) 18. The latter digitizes the analog weight data signal $S_p$ to produce a digital output $S_d$ which is applied to a computation controller 20. The latter is composed of a microcomputer and includes a processor (CPU) 21 for performing combinatorial processing, a read-only memory (ROM) 22 for storing a processing program for combinatorial processing, and a random-access memory (RAM) 23 for storing the weight data as well as the results of processing performed by the processor 21. The computation controller 20 computes combinations on the basis of the weight data, selects a combination giving a total combined weight value equal or closest to a target weight, and delivers a drive signal to drive units $25_{-1}, 25_{-2} \ldots 25_{-n}$ of respective weighing hoppers belonging to those weighing machines which correspond to the selected combination.

Thus, the multiple input signal A/D converter circuit converts, into a digital value, the analog weight data signal $S_o$ delivered successively in a time series by the multiplexer 13. As shown in FIG. 2, the A/D converter circuit successively samples and holds the weight data $S_1, S_2, S_3 \ldots S_n$ by means of the single sample/hold circuit 15 before delivering the data to the A/D converter 18. Unless the sample/hold circuit 15 operates at a sufficiently long sampling time, a capacitor 16 (FIG. 1) for raising sampling precision cannot be charged. Accordingly, the A/D converter 18 is inoperative during sampling time, which is on the order of about 10 usec. This means that the conventional multiple input signal A/D converter circuit cannot make effective use of the A/D converter 18 despite the fact that the latter is capable of performing a conversion at high-speed.

SUMMARY OF THE INVENTION

An object of the present invention is to provide a multiple input signal high-speed analog-digital converter circuit which is capable of subjecting a number of input signals to an A/D conversion at high speed by making effective use of an A/D converter having a high-speed processing capability.

According to the present invention, the foregoing object is attained by providing a multiple input signal high-speed analog-digital converter circuit having a multiplexer for successively delivering a number of input signals applied thereto, two sample/hold circuits which receive an output signal from the multiplexer and for repeatedly sampling and holding the signal, a changeover switch for keeping one of the sample/hold circuits on hold while the other sample/hold circuit samples the output signal of the multiplexer, and an analog-digital converter which receives signals from the two sample/hold circuits, for converting the signals into digital values which are then delivered as output signals.

Thus, with the multiple input signal high-speed analog-digital converter circuit of the present invention, while one of the sample/hold circuits is holding an input signal, the other sample/hold circuit is sampling another input signal. Accordingly, the A/D conversion time of the multiplicity of input signals is capable of being shortened by the sampling time of the sample/hold circuits, so that effective use can be made of the A/D converter having the high-speed processing capability.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

FIG. 4 is a timing chart for the operation of sample/hold circuits in the arrangement of FIG. 3.

DESCRIPTION OF THE PREFERRED EMBODIMENT

Figure 3:
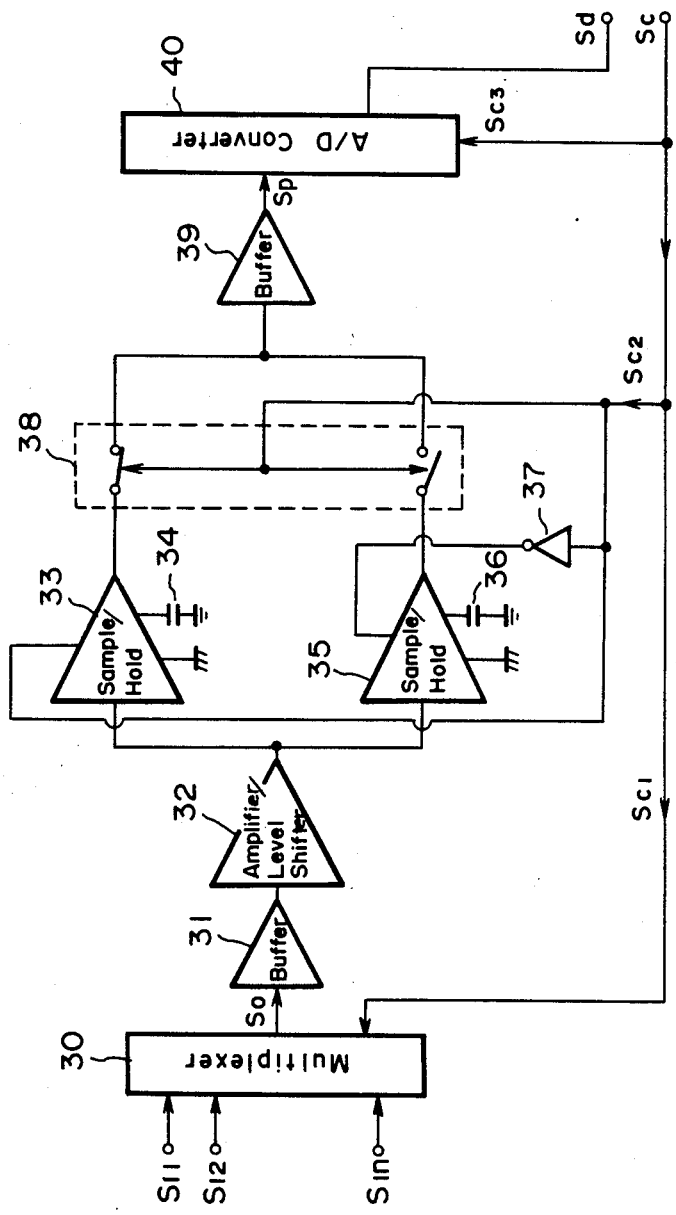
FIG. 3 is a circuit diagram of a multiple input signal high-speed analog-digital converter circuit embodying the present invention.

FIG. 3 illustrates a multiple input signal high-speed analog-digital converter circuit according to the present invention, and FIG. 4 is a timing chart illustrating the operation of sample/hold circuits included in the arrangement of FIG. 3.

Figure 1:
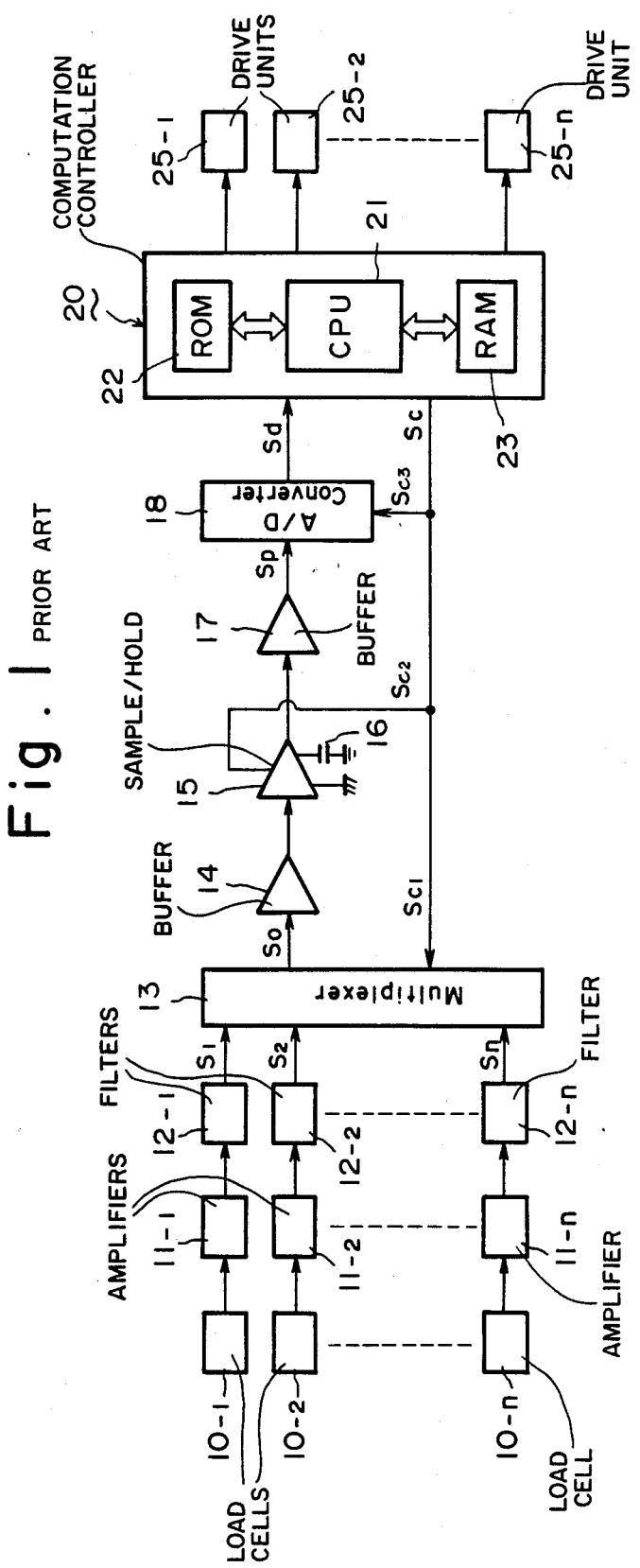
FIG. 1 is a block diagram of a combinatorial weighing apparatus having a multiple input signal analog-digital converter circuit according to the prior art.
Figure 2:
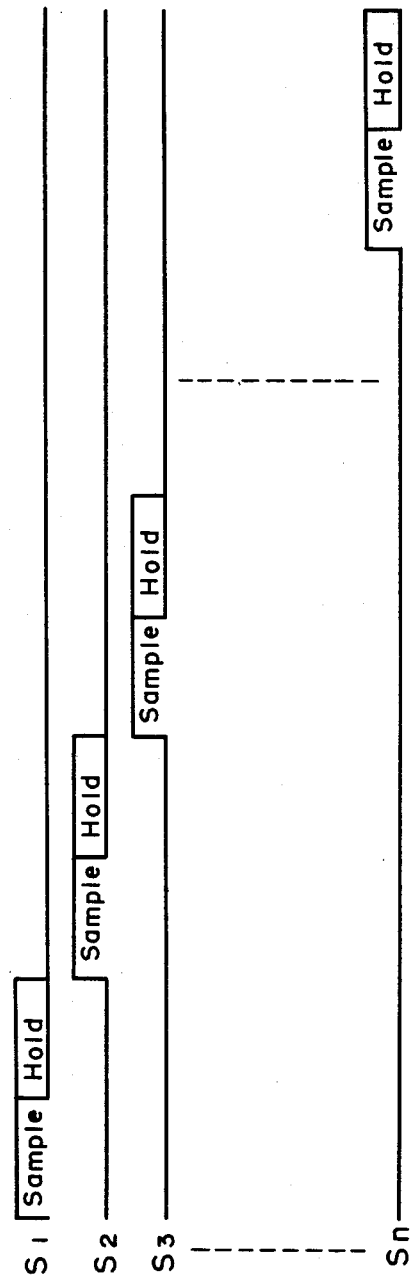
FIG. 2 is a timing chart for the operation of a sample/hold circuit of a multiple input signal analog-digital converter.

In FIG. 3, weight data from the load cells $10_{-1}$, $10_{-2} \ldots 10_{-n}$ of the plural weighing machines in the combinatorial weighing apparatus of FIG. 1, are applied as multiple input signals $S_{11}$, $S_{12} \ldots S_{1n}$ to a multiplexer 30. The multiplexer 30 selectively applies the weight data as a weight data signal $S_o$ to a buffer circuit 31 sequentially in a time series. The buffer circuit 31 delivers the weight data signal $S_o$ received from the multiplexer 30 to an amplifier/level shift circuit 32 upon subjecting the signal to an impedance conversion. The amplifier/level shift circuit 32 delivers the weight data signal from the buffer circuit 31 after adjusting the mu-factor and zero level of the signal.

Numerals 33, 35 denote first and second sample/hold circuits, respectively, both of which receive the output signal $S_o$ of the multiplexer 30 via the buffer circuit 31 and amplifier/level shift circuit 32 for repeating a sample-and-hold action. The first and second sample/hold circuits 33, 35 are equipped with capacitors 34, 36, respectively, for being charged when the weight data signal is sampled and for holding the charge when the signal is held.

A changeover switch 38 permits only one of the first and second sample/hold circuits 33, 35 to deliver an output at any time in such a manner that one of the sample/hold circuits is made to perform a holding operation while the other performs a sampling operation. The output of the changeover switch 38 (namely), a weight data signal from one of the sample/hold circuits 33, 35 is applied to a buffer circuit 39 which delivers the signal as a signal $S_p$ following an impedance conversion. An A/D converter 40 digitizes the analog weight data signal $S_p$ to produce a digital output signal $S_d$ which is applied to, for example, the computation controller 20 of FIG. 1. The computation controller performs a digital computation based on the weight data signals $S_{11}$, $S_{12} \ldots S_{1n}$ received from the respective weighing machines to a combination closest to a target weight value.

To perform the foregoing operation, the computation controller produces a control signal $S_c$ and applies the signal synchronously to the multiplexer 30 (as a selection signal $S_{c1}$, to the first and second sample/hold circuits 33, 35 and changeover switch 38 (as a changeover command signal $S_{c2}$), and to the A/D converter 40 (as a control signal $S_{c3}$). In response to the selection signal $S_{c1}$ applied to the multiplexer 30, signals from among the multiple input signals $S_{11}$, $S_{12} \ldots S_{1n}$ are selected for application to the sample/hold circuits 33, 35, which also receive the changeover command signal $S_{c2}$, with the second sample/hold circuit 35 receiving the signal via an inverter 37. Accordingly, as shown in FIG. 4, while one input signal is being held by the first sample/hold circuit 33 or second sample/hold circuit 35, the following input signal is being sampled by the other sample/hold circuit 35 or 33. Further, in response to the control signal $S_{c3}$ applied to the A/D converter 40, the A/D conversion ends. When this occurs, the holding of one input signal ends and the holdling of the following input signal begins. In other words, A/D conversion now starts and, at the same time, so does sampling of the next input signal. This operation is performed repeatedly so that digital computations are carried out while the A/D conversion continues at high speed without a pause. It goes without saying that the same method can be employed when an item of weight data from a single weighing machine is sampled a plurality of times followed by switching the multiplexer to sample weight data from the next weighing machine.

Though an embodiment has been described wherein the present invention is used in a combinatorial weighing apparatus, the invention is not limited to such an embodiment but can be modified in various ways within the scope of the claims.

What I claim is:

1. A multiple input signal high signal high-speed analog-digital converter circuit for use with a combinatorial weighing apparatus which provides input data signals to said multiple input signal high-speed analog-digital converter circuit, comprising:

a multiplexer, operatively connected to receive the input data signals, for sequentially providing the input data signals in a time series as a first output;

a first sample/hold circuit, operatively connected to said multiplexer, for receiving the first output signal, for repeatedly sampling and holding the first output signal and for generating a second output signal;

a second sample/hold circuit, operatively connected to said multiplexer, for receiving the first output signal, for repeatedly sampling and holding the first output signal, and for generating a third output signal;

a changeover switch, operatively connected to said first and second sample/hold circuits, for selectively maintaining one of said first and second sample/hold circuits in a hold state, while the other of said first and second sample/hold circuits samples the first output signal from said multiplexer;

an analog-digital converter, operatively connected to said first and second sample/hold circuits, for receiving the second and third output signals and for converting the second and third output signals into a digital output signal which is provided as an output of said analog-digital converter;

a first buffer circuit, operatively connected to said multiplexer, for performing impedance conversion on the first output signal; and an amplifier/level shifter circuit including an amplifier having an adjustable mu-factor, connected between said first buffer circuit and said first and second sample/hold circuits, for adjusting the mu-factor of the amplifier and the zero level of the first output signal, after said first buffer circuit has performed impedance conversion on the first output signal, and for providing the first output signal to said first and second sample/hold circuits.

2. A multiple input signal high-speed analog-digital converter circuit as set forth in claim 1, further comprising a second buffer circuit, connected between said changeover switch and said analog-digital converter, for performing an impedance conversion on the second and third output signals in accordance with the state of said changeover switch.

* * * * *

UNITED STATES PATENT AND TRADEMARK OFFICE
CERTIFICATE OF CORRECTION

PATENT NO. : 4,677,422
DATED : JUNE 30, 1987
INVENTOR(S) : KAZUFUMI NAITO

It is certified that error appears in the above-identified patent and that said Letters Patent is hereby corrected as shown below:

Col. 1, line 42, "impendance" should be --impedance--;
line 46, "impend-" should be --imped- --.

Col. 3, line 36, (namely)," should be --(namely,--;
line 38, "35" should be --35)--;
line 46, "to a" should be --to determine a--;
line 50, "$S_{c1}$," should be --$S_{c1}$),--.

Col. 4, line 24, "output;" should be --output signal;--.

Signed and Sealed this

Thirteenth Day of October, 1987

Attest:

DONALD J. QUIGG

Attesting Officer

Commissioner of Patents and Trademarks